United States Patent [19]

Taborn et al.

[11] Patent Number: 5,255,239

[45] Date of Patent: Oct. 19, 1993

[54] BIDIRECTIONAL FIRST-IN-FIRST-OUT MEMORY DEVICE WITH TRANSPARENT AND USER-TESTABLE CAPABILITIES

[75] Inventors: Michael P. Taborn; Larry Metzger, both of Austin, Tex.; David R. Horton, Apple Valley, Minn.

[73] Assignee: Cypress Semiconductor Corporation, San Jose, Calif.

[21] Appl. No.: 745,073

[22] Filed: Aug. 13, 1991

[51] Int. Cl.[5] .................................... G11C 7/00
[52] U.S. Cl. ........................ 365/221; 365/230.05; 365/201; 377/28
[58] Field of Search ............. 365/221, 73, 78, 230.05, 365/201; 377/67, 69, 28

[56] References Cited

U.S. PATENT DOCUMENTS

| | | | |
|---|---|---|---|
| 4,819,201 | 4/1989 | Thomas et al. | 365/221 X |
| 4,833,655 | 5/1989 | Wolf et al. | 365/221 |

*Primary Examiner*—Joseph A. Popek
*Attorney, Agent, or Firm*—Larry K. Roberts

[57] ABSTRACT

A multi-featured first-in-first-out (FIFO) memory device on a monolithic semiconductor integrated circuit chip. The FIFO device is bi-directional, in that the user may select the direction of data transfer through the device. The device may be configured in a transparent bypass mode of operation, wherein the FIFO memory array is bypassed, and data is transferred directed from either device input/output port to the other device input/output port. In another mode of operation allowing registered bypass operation, a byte of data may be written in an internal register from the device port being used to output data for later transfer to the device port presently being used to input data to the FIFO memory array. The FIFO device further includes a user-testable mode of operation, wherein data written into the FIFO memory array through a device input port may be read out of the same device input port. Device mode selection occurs through control pin slew detection, allowing mode selection with a minimum number of control pins.

21 Claims, 9 Drawing Sheets

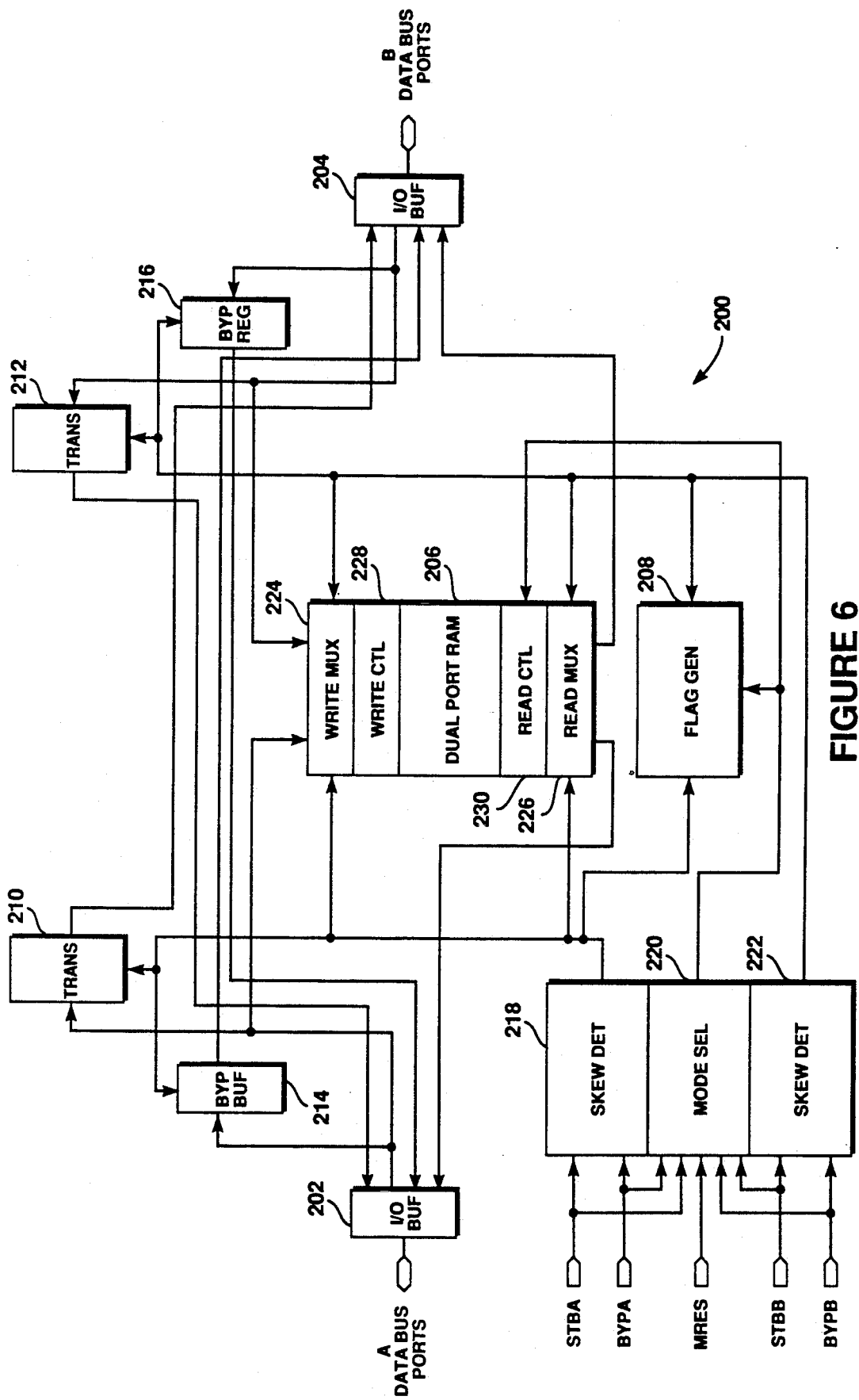

BIDIRECTIONAL FIRST-IN-FIRST-OUT MEMORY DEVICE WITH TRANSPARENT AND USER-TESTABLE CAPABILITIES

BACKGROUND OF THE INVENTION

The present invention relates to first-in-first-out (FIFO) semiconductor integrated circuit devices.

A FIFO is a buffer memory where data becomes available to the output port in the same order it was presented to the input port. One purpose of the present invention is to provide a bidirectional FIFO that can be directed according to the needs of the application and allow the user to drive through the device to program devices connected to the opposite bus.

There have been numerous prior approaches to the problem of a bidirectional FIFO. The most prevalent is to use two separate FIFO devices with associated control logic implemented in programmable logic devices. Recently, bidirectional FIFOs have appeared in silicon; however, these FIFOs offer a very complex approach in that two FIFOs are implemented "back-to-back." This is a very cumbersome and expensive way to solve the problem. Typically the user does not require simultaneous transfer of data in both directions; instead applications require FIFO data in one direction or the other at various times. Moreover, such approaches suffer the disadvantages of increased complexity and cost, and with adverse effects on the device speed. According to one aspect of the present invention, a single FIFO memory array whose directionality may be altered is utilized.

Another aspect of the present invention is to provide a means by which the user of the FIFO device can test the contents of the FIFO with no external circuits. Conventional FIFO designs require that the user add several external devices to the FIFO to allow the data previously written into the FIFO to be read out by the device that wrote the data. This conventional approach requires these additional devices and additional board space.

A further aspect of the present invention is to provide an alternate method of device-mode selection by means of control signal edge placement (skew). Previous or conventional devices have used methods such as extra control pins, encoded pin signals, clocking mode-information, and complex control protocols to provide additional modes of operation. Disadvantages of the conventional approaches include higher pin counts, increased complexity, or deviations from the standard or traditional operationality. Quite often, the user must learn a dramatically different functionality.

SUMMARY OF THE INVENTION

A bi-directional FIFO device fabricated on a monolithic integrated circuit chip is described which employs a single FIFO memory array for holding the FIFO data no matter which direction data is transferred through the FIFO device. Means responsive to control signals selects which of the two device input/output ports is to provide the input data, with the other device input/output port serving to provide the device output data. The selection means can comprise a first multiplexing means which selectively couples either of the two I/O ports to the FIFO memory array input port, and a second multiplexing means which selectively couples the other of the two I/O ports to the FIFO memory array output port.

The FIFO device further includes the capability of a transparent bypass mode of operation, wherein the FIFO memory array is bypassed, and data may be selectively transferred directly from one device I/O port to the other.

The FIFO device may also include a registered bypass mode of operation, wherein a byte of data may be transferred from one of the device I/O ports to an internal clocked register, for later transfer to the other of the device I/O ports.

In accordance with another aspect of the invention, a user-testable FIFO memory device on a monolithic integrated circuit chip is described, wherein during a test mode, data written into the FIFO memory array through the device input ports may be read out from the same device port. This permits verification of the data written into the FIFO device by the same device which wrote the data into the FIFO memory array.

A further aspect of the invention is a method of mode selection which adds the capability of selecting additional device modes through first and second device control pins. The method includes the steps of:

observing the state of the first and second control pins;

starting a predetermined "time out" time interval in the event the state of the first pin transitions to a predetermined state;

selecting a first device mode if the second control pin transitions to a predetermined state before expiration of the "time out" interval; and selecting a second device mode if the second device control pin does not transition to the predetermined state before expiration of the "time out" interval.

The new method of mod selection allows the circuit designer to take advantage of applications where the internal, critical path times of the device differ, but are "speced" (i.e., specified to be) the same.

BRIEF DESCRIPTION OF THE DRAWING

These and other features and advantages of the present invention will become more apparent from the following detailed description of an exemplary embodiment thereof, as illustrated in the accompanying drawings, in which:

FIG. 6 is a schematic block diagram of a FIFO integrated circuit device embodying the bi-directional, user-testable and control signal skewing aspects of the present invention.

DETAILED DESCRIPTION OF THE PREFERRED EMBODIMENT

The three primary aspects of the present invention will be discussed separately in an overview, and then an exemplary implementation in a FIFO embodying the three aspects of the invention in a single device will be described.

Figure 1:
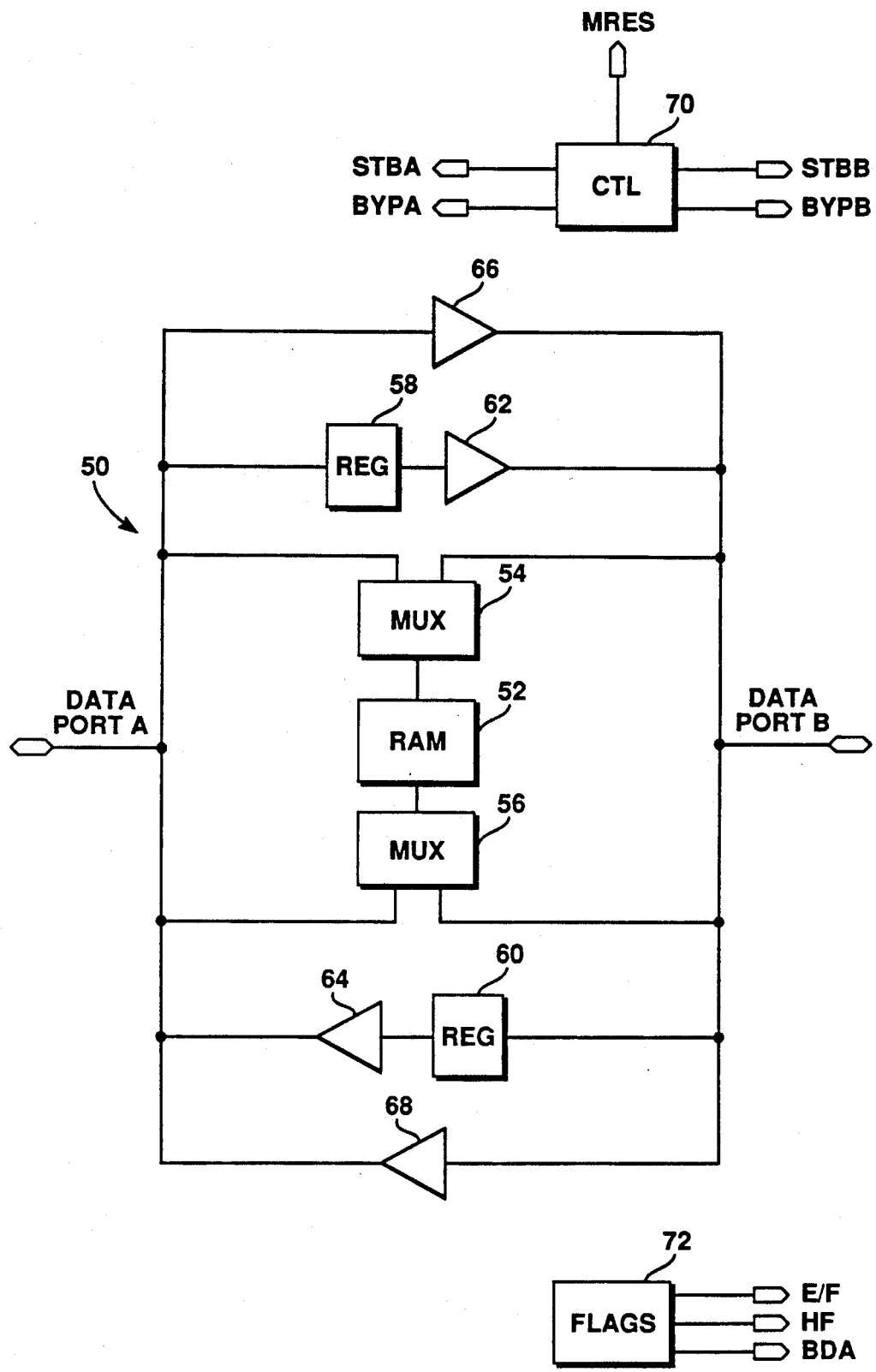
FIG. 1 is a simplified block diagram illustrative of a FIFO semiconductor integrated circuit embodying the bi-directional aspect of the present invention.

FIG. 1 is a simplified block diagram illustrative of a half-duplex FIFO device 50 which is bidirectional in accordance with the invention. Half duplex operation refers to the ability to transfer data in one direction at a time (either port A is input and port B is output or port A is output and port B is input). This contrasts with full duplex operation that allows both ports to read and write large amounts of data simultaneously (port A is input to a FIFO and an output from another FIFO; the same for port B). The device 50 includes data ports A and B, a random access memory 52, and multiplexers 54 and 56 which enable half-duplex operation. Registers 58 and 60 and tri-state buffers 62 and 64 enable a registered bypass mode of operation. Tri-state buffers 66 and 68 permit transparent, bidirectional communication through the chip.

Control logic 70 is responsive to pin signals STBA, STBB, BYPA and BYPB to develop internal control signals for controlling the operation of the device 50. Flag generation logic 72 generates several flags, i.e., E/F, HF and BDA.

The registered bypass feature provides a means of transferring one word of data from one data port to the other data port without affecting either the contents of the FIFO memory 52 or the FIFO operations occurring at the other port. The data is written by one port into a clocked register, either register 58 or 60, for later retrieval by the other port, and a flag is generated (BDA) to notify the other port that data is available. This feature is useful in applications requiring to return status or error indication. The direction of Registered Bypass data transfer is in the opposite direction to the FIFO, and thus is determined by the same means as the FIFO direction. This is by means of a Master Reset (MR) cycle (see Table 1). The MR cycle entails asserting and negating the MRES pin of the device for a minimum period of time to allow the internal logic of the device to reset. It is required in the cycle that the STBx (STBA or STBB) pins are deasserted. Each port controls the Registered Bypass operation by toggling a pin BYPx (BYPA or BYPB).

The Transparent Bypass feature is another method of sending data "around" the FIFO memory 52. In this case however, data may be sent in either direction at any time and therefore is more powerful. This feature is useful for applications that need to program a "dumb" peripheral connected to the FIFO device. The FIFO memory contents are not affected by the use of the Transparent Bypass feature, but the control signals for this feature are shared with those of the normal FIFO operation. Therefore, the host device wishing to send immediate data to the other host must ensure that the other port will not attempt a FIFO Read or Write during the time that the transparent bypass is occurring. (If this is not possible, Registered Bypass, or external circuitry could be used.) The restriction of the transparent bypass involves simultaneous assertion of invalid combinations of control pins. This device will protect the application and itself by recognizing these states and putting all the external busses into high impedance state.

Since the device does not have a clock to synchronize assertions of pins, internal delay lines and clocks are generated to recognize and disable internal events as the pins are taken through invalid states. The transfer is initiated by simply driving two control pins low together (STBx and BYPx); this causes the data at the initiating port to be driven to the other port. The host device must monitor through external circuitry the status of the control pins of the other host to ensure an illegal state of the control pins does not occur.

The operation of the FIFO device 50 is uncomplicated, and requires only one control pin per port (STBx). The user determines the direction of the FIFO data flow by initiating an MR cycle, as illustrated in Table 1. This has the effect of setting the multiplexers 54 and 56. This allows only unidirectional data flow, but the direction can be flipped at any time by initiating master reset operation. Having chosen the data flow direction, this also sets the registered bypass direction. FIFO data are written through the appropriate port by a rising edge at STBx, and read from the appropriate port by a low level at STBx. The two ports are completely asynchronous and independent.

TABLE I

| | | (x = 1 or 0) | | | |
|---|---|---|---|---|---|
| BYPA | BYPB | STBA | STBB | MRES | ACTION |
| x | x | x | x | 1 | Normal Operation |
| 0 | 0 | x | x | ⟍⟋ | Test Mode |
| 1 | 1 | 1 | 1 | ⟍⟋ | Direction A to B, Reset Phase |
| 0 | 1 | 1 | 1 | ⟍⟋ | Direction B to A, Reset Phase |
| x | x | x | x | 0 | Master Reset |

There are two pins (E/F, HF*) which are used to depict three important FIFO conditions, Full, Empty and Half-Full.

Figure 2:
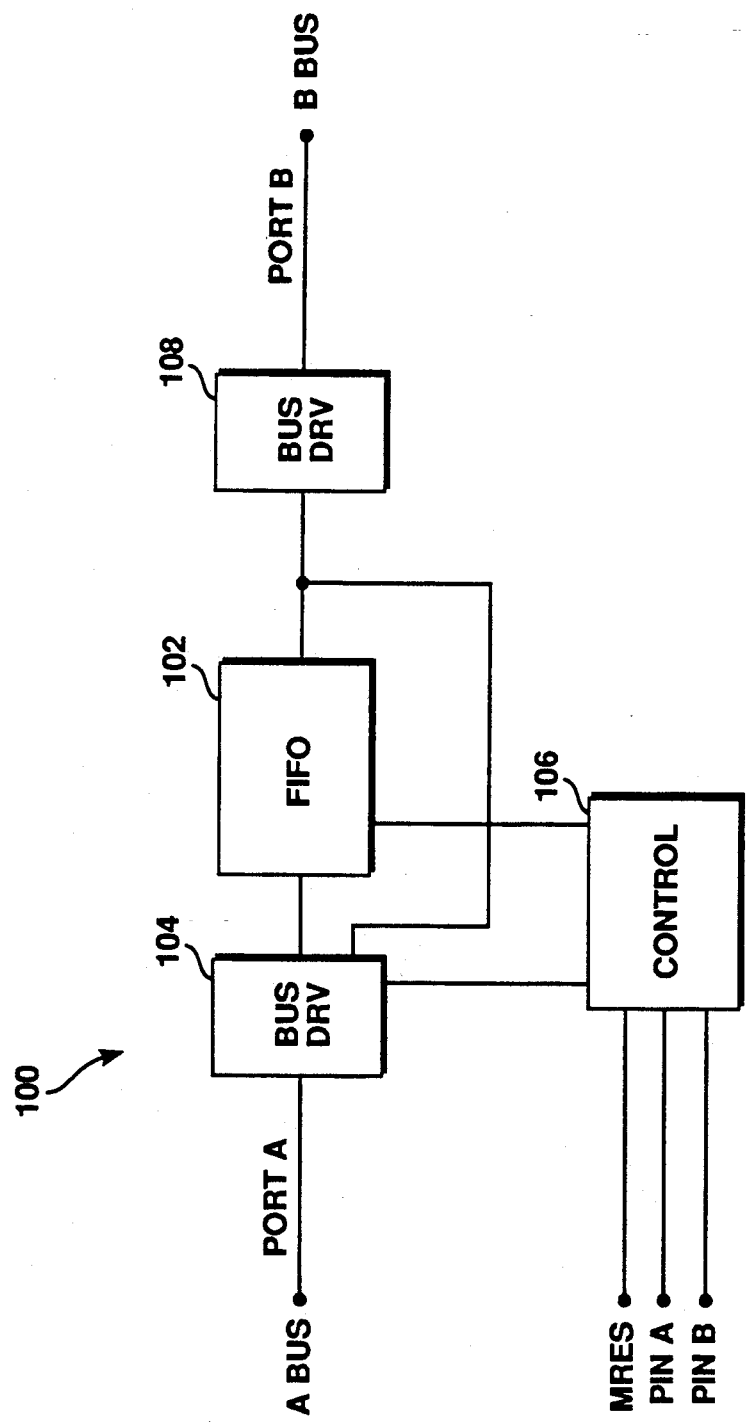
FIG. 2 is a block diagram of a user-testable FIFO in accordance with the invention.

FIG. 2 illustrates another aspect of the present invention, one which allows the user of the FIFO device to test the contents of the FIFO with no additional external circuits. The block diagram of FIG. 2 shows a device 100 comprising a FIFO circuit 102, and a bidirectional buffer 104 and associated control circuitry 106 for controlling the data flow from and to Port A, the write bus. Circuit 104 consists of an input/output port. A bus driver 108 drives the FIFO data from the FIFO 102 to port B, the read bus. The same data from the FIFO 102 is always available at the buffer 104, with the means to make it selectively available at Port A, depending on the mode of operation of the device. In the write mode of operation, data is routed into the FIFO port A and into the FIFO 102. In the read mode of operation, data is routed out of the FIFO 120 and out of port B. In the user-testable mode of operation, data is routed out of the FIFO on the same Port A that it was written in from.

Figure 3:
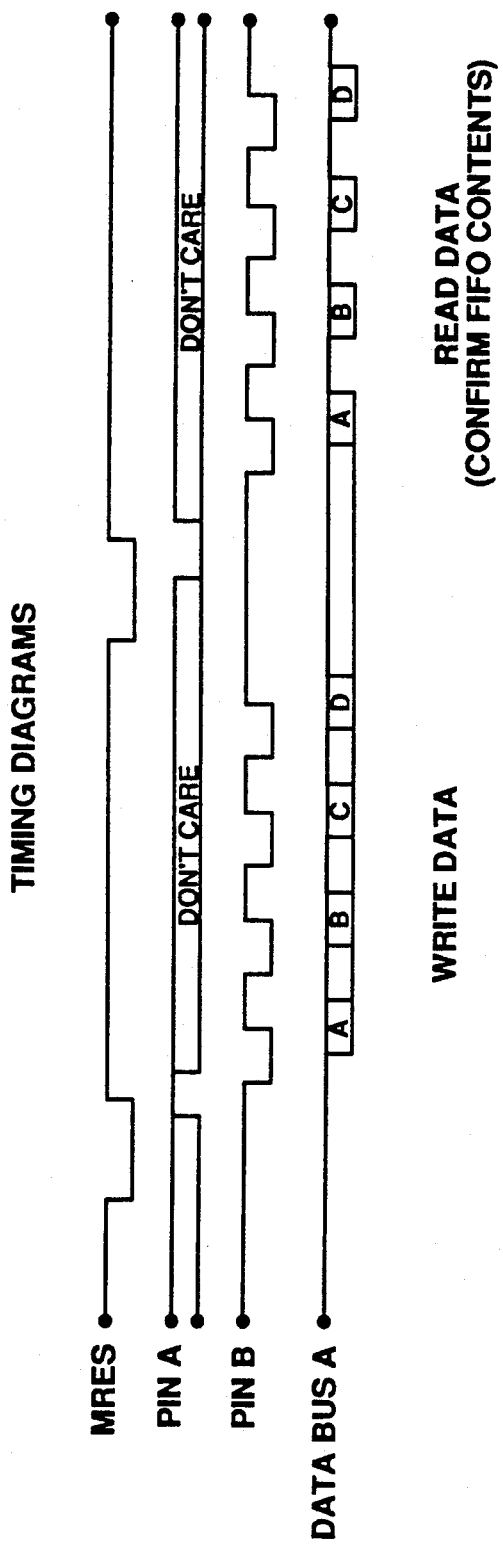
FIG. 3 shows exemplary timing diagrams for the user-testable FIFO of FIG. 2.

The user uses control pin A in combination with the reset pin state to select the direction of data flow, as shown in the signal timing diagram of FIG. 3. The user employs control pin B to either read or write the data. If control pin A is asserted and the reset pin is asserted, subsequent assertions of control pins B will write data from Port A into the FIFO 102. If control pin A is negated when the reset pin is asserted, subsequent assertions of the control pin B will cause the contents of the FIFO to appear on port A.

The FIFO shown in FIGS. 2 and 3 has the advantage of allowing the user to test the contents of the FIFO with no external circuits. Conventional methods of testing the contents of FIFOS required several additional devices and additional board space. The present solution integrates the function in silicon in a single integrated circuit chip. Because of this integration, the invention provides additional advantages of reliability, cost and speed over conventional arrangements employing several additional devices.

A third aspect of the invention is an alternate method of device-mode selection by means of control signal edge placement (skew). The objectives of this aspect of the invention is to allow additional device modes with ease of use, without an increase in pin count, with no degradation of primary specifications, and with allowance, should the user so desire, of the traditional timing if the additional mode is not needed. This implies that the device can be easily operated in a manner of typical FIFOs, and when the additional functionality is desired, it is a simple extension, and has no impact on the normal FIFO performance parameters.

Previous devices known in the art have used methods to achieve mode selection such as extra control pins, encoded pin signals, clocking mode-information, and complex control protocols to provide additional modes of operation. The major disadvantages of these conventional methods are that they require higher pin counts, increased complexity, or must deviate from the standard or traditional operationality. Quite often the user must learn a dramatically different functionality.

The basic concept of operation of the new technique of mode selection is described with respect to the bidirectional FIFO device discussed above, generally illustrated in FIG. 4, although the technique is not limited to such a device. In the following discussion, the FIFO implementation involves pairs of control pins although the concept can readily be extended to more pins.

As set forth above, the FIFO 150 comprises a buffer memory 152 where, in one mode, data becomes available to the output port in the same order it was presented to the input port. The device has control logic 154 which acts in response to pin signals STBA, STBB, BYPA and BYPB to control the operation of the device 250. The device 150 has two ports, port A and port B. The STBA and BYPA pins control the port A operations and the STBB and BYPB pins control the port B operations. The bidirectional feature discussed above with respect to the device of FIG. 1 means that it can be operated half-duplex in either direction. As an illustration, consider the direction of data transfer to be port A to port B, where the STBA signal, when asserted low, would traditionally force a write to port A condition. The Registered Bypass mode is an additional mode whereby an internal register can be read from port A, by asserting the BYPA signal low. Now examine an additional mode that can be made available by asserting both pins low in a certain manner, not a simple combinatorial scheme where the pin states combinatorially define the mode. In typical RAM implementations a decoded scheme involves a strobe to indicate when a signal or signal set is valid. Only then does the device perform the task. If implementing a pure decoded scheme, this application would require three pins per control set. Instead the device generates this strobe internally using delay lines and the external device timing restrictions.

An additional mode called the Transparent Bypass mode, where data can be transferred directly through the part, can be entered in the following manner. When the BYPA pin is asserted, normally, as if to go into the Registered Bypass mode, internally the part doesn't immediately enter that mode. If within a certain time window, the STBA pin (normally the FIFO access pin) is asserted, the part will enter the Transparent Bypass mode. After this "time-out," if the STBA pin has not been asserted, the part will indeed internally enter the Registered Bypass mode. The internal "hold-off" is important in that there are internal events that must not happen until it is certain that the cycle is indeed a Bypass Register access. This method does not require an additional pin, and should the user desire not to use the Transparent Bypass mode, the FIFO and register operations are with the traditional timing (FIFO access with STBA pin asserted, register access with BYPA). While this example illustrated FIFO read, register write, the converse is an analogous case (FIFO write, register read).

With this methodology, one can take advantage of cases where internal, critical path times differ, but are "speced" or specified the same. The FIFO is an excellent example. The user has no need for the register access to be "speced" faster than the FIFO (RAM) access, although in reality it could be. Therefore, this speed differential can be taken advantage of by holding off the internal mode selection of a Bypass Register read upon BYPA being asserted, for the "time-out" window, and if no STBA assertion, subsequently read the register and still have its data out by the specified time.

Figure 4:
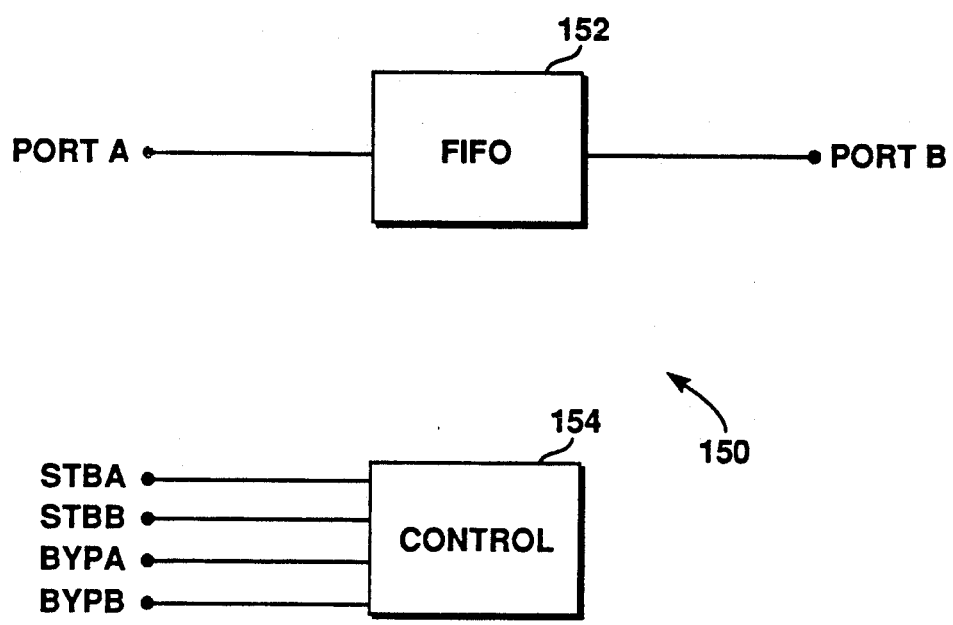
FIG. 4 is a block diagram of a FIFO device employing control signal skewing for mode selection.
Figure 5A:
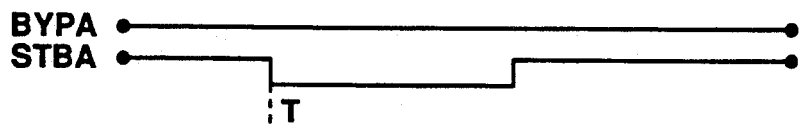
FIGS. 5A–5C show timing diagrams illustrative of the operation of mode selection of the device of FIG. 4.
Figure 5B:
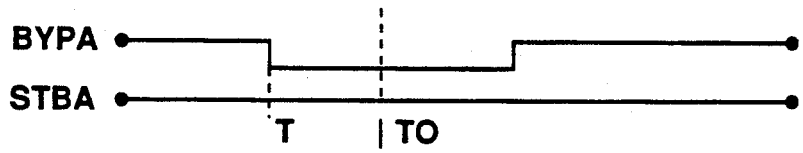
Figure 5C:
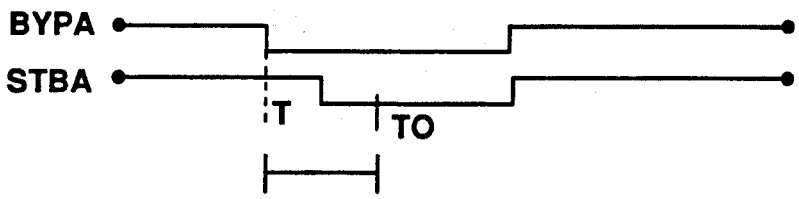

FIGS. 5A-5C illustrate signal waveform timing of several signals of negative polarity sense controlling the mode of operation of the device of FIG. 4. FIG. 5A shows the signals BYPA and STBA which control the FIFO write mode. STBA goes true at time T, while BYPA remains false, thereby indicating the FIFO is to be written to. FIG. 5B shows the signals BYPA and STBA which control the register read mode. Here STBA goes true at time T; time TO indicates the internal "time out" point from time T at which the device decides to enter the bypass register mode. FIG. 5C illustrates the timing of the signals BYPA and STBA in order to enter the transparent bypass mode. Here, BYPA goes true at time T, with STBA also going true within the time-out interval between T and TO, so that the device enters the transparent bypass mode instead of the register read mode.

There are several advantages of this method of mode selection over the conventional techniques of selecting the device operating mode. First, there is no increase in pin count; i.e., no additional control pins are required. Secondly, the new control functionality is an addition to that previously used, such that the basic timing can remain essentially unchanged with the inclusion of additional functionality. The user not opting to utilize the additional functionality still can use the familiar basics. Thirdly, this new method can take advantage of the cases where internal critical path times differ, but are specified to be the same, e.g., a RAM access time as compared to a register access time.

As a particular example embodying all three aspects of the invention, consider the bi-directional FIFO part 200 shown in FIG. 6. This implementation of the FIFO is unique in that features have been added that enhance the usefulness of the device in varying applications. The input and outputs ports of the device can be exchanged effectively changing the devices' data direction. The FIFO has the ability to pass data directly through the device becoming "invisible" to the application. The FIFO has two registers that allow data to proceed in the opposite direction of FIFO operation. Finally, the FIFO has the ability to allow data "written" into the FIFO to be "read" back out of the same port (as opposed to the opposite port used in normal operation).

I/O buffers 202 and 204 provide the input and output ports used for data transfer in all operations. The device 200 uses a dual port static RAM array 206 to hold the data. Flag generation logic 208 is used to generate status flags output by the FIFO. These flags indicate the status of data within the FIFO as well as the status of data in the bypass registers 214 and 216.

Circuit 210 and 212 are used to separate the internal buses of the I/O buffers 202 and 204 and to support the "invisible" or "transparent" feature of the FIFO 200. Blocks 218, 220 and 222 along with the five control signals (STBA, BYPA, MRES, STBB, BYPB) control the function of the FIFO during operation. Blocks 224 and 226 are the read and write multiplexers used to route data from/to I/O buffer 202 or 204. Blocks 228 and 230 are counters used to hold the address information of the data written into or read from the FIFO 200.

The mode of operation for the FIFO 200 is determined in blocks 218, 220 and 222 using the external inputs STBA, BYPA, MRES, STBB and BYPB. Block 220 determines the direction of the FIFO. The MRES pin is asserted thereby forcing the block 220 to force I/O buffers 202 and 204 into an idle condition and resetting all the flag generation (block 208) and the address counters (block 228 and 230). When the MRES pin is deasserted, the state of the BYPB and BYPA control inputs are recorded and used to set the direction of the FIFO (writing to buffer 202 and reading from buffer 204, or writing to buffer 204 and reading from buffer 202) or the test mode feature of the FIFO (allowing the user to read back data written from the write port).

When the FIFO 200 is configured to transfer data from pins of buffer port 202 to the FIFO memory 206, an assertion of STBA will cause data to go through the write multiplexer 224 into the FIFO memory 206. This will also cause the write counters 228 to increment to a new "empty" FIFO location and cause the EF flag from the flag generation logic 208 to be deasserted indicating a non-empty state of the memory 206 if the memory was previously empty. In this same configuration, if the STBB pin is asserted, the data is read from the location pointed to by the read counter 230 and driven through the read multiplexer 226 to the output pins of buffer 204. The assertion of the STBB pin will cause the read counter to increment to the next data location and cause the flag generation logic 208 to deassert/assert the EF flag depending on the status of the data within the FIFO.

In the event that the FIFO is set to use buffer 202 as the input and buffer 204 as the output, the registers 216 and 214 are set so that if the user asserts the BYPA pin, the data inside register 216 will be presented on the buffer 202 output pins. In the event the FIFO is set to use buffer 204 as the input, buffer 202 as the output and then the assertion of BYPA will cause data on the pins of buffer 202 to be latched into register 214. A subsequent assertion of the BYPB pin will cause the data inside register 214 to be presented on the output pins of buffer 204. The assertion of these pins cause the flag generation logic 208 to assert the BDA status pin when data is latched into register 216 and 214 and the deassertion of BDA when data is presented on the output ports (buffers 202 or 204).

The assertion of both the BYPA and STBA pins simultaneously cause the device 200 to enter the "invisible" or transparent state. Any data presented on the port pins of buffer 202 will appear on the port pins of buffer 204. Conversely, the assertion of STBB and BYPB simultaneously will cause data presented on the port pins of buffer 204 to appear on the port pins of buffer 202. This is accomplished using blocks 210 and 212 internally along with blocks 218 and 222 for control. Block 218 and 222 determine that both pins have to be asserted and effectively allow data from buffer 202 to flow into block 210 in the STBA/BYPA assertions. In the STBB/BYPB assertions the blocks 218 and 222 allow data from buffer 204 into block 212 and onto the output pins of buffer 202.

Blocks 218 and 222 are skew detect circuits. This implementation defines four states of logic with two control pins and no clock: FIFO write/read; transparent read/write; register read/write; idle. Since all four states are valid states, a skew detect circuit is implemented to recognize the difference in the signals and wait to determine the actual state of the device until a certain timeout has been recognized, as described above regarding the device of FIGS. 4 and 5. The skew detect function takes advantage of the fact the read and write times of registers 214 and 216 are much faster than the memory read and write times so this methodology does not effect the access times for the RAM 206. The bypass registers are written at the end of the bypass register write cycle.

In normal operation, the BYPA pin can be asserted, but only after a certain delay will the appropriate bypass register operation proceed. If STBA is asserted in a certain time frame after BYPA, the skew detect will change what was a register write/read into an "invisible" or transparent cycle presenting data on the buffer 202 port to buffer 204 port pins. The same is true for pins BYPB and STBB with the transparent data transfer being from the buffer 204 port to the buffer 202 port. The STBA pin can then be toggled and the buffer 204 port pins will go from high impedance to drive depending on the state of STBA.

The skew detect also works if the STBA pin is asserted first. The device is designed not to write the data until the end of the cycle (when STBA is deasserted) so the circuits 218 and 220 recognize the STBA pin asserted and starts a normal FIFO cycle; however, if BYPB is asserted, the cycle type changes and becomes the "invisible" mode. Since no write is done until the end of the cycle, no data is destroyed if BYPA is asserted.

Figure 7:
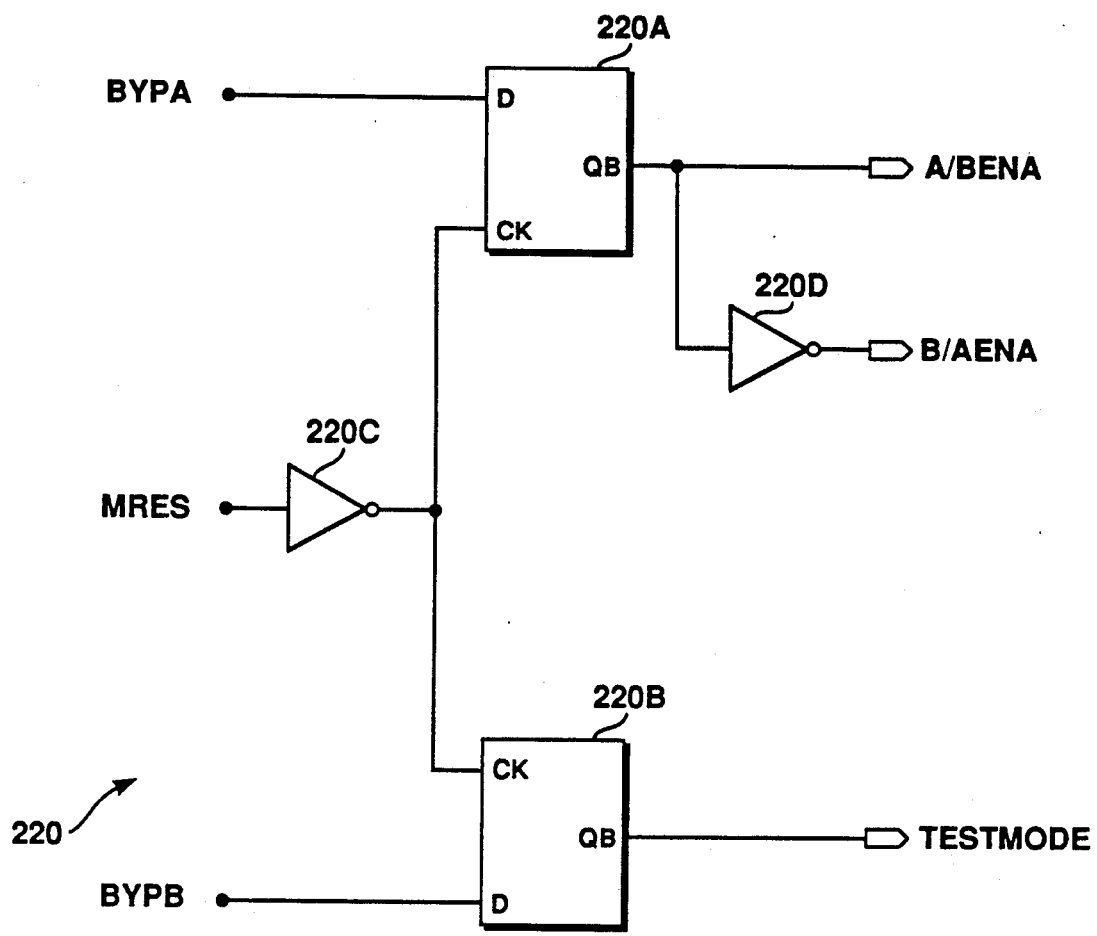
FIGS. 7 and 8 are schematic diagrams illustrative of respective circuit elements of the device of FIG. 6.

FIG. 7 illustrates circuit 220, which develops the control signals A/BENA, B/AENA and TESTMODE from the pin signals BYPA, MRES and BYPB. The circuit 220 includes two registers 220A and 220B, each clocked by the signal MRES. The data input to register 220A is BYPA, while the data input to register 220B is BYPB. The clocked Q output from register 220A is the signal A/BENA; the inverted form of the Q output is the signal B/AENA. The true state of signal A/BENA indicates that transparent operation from port A to port B has been enabled; the true state of the signal B/A-ENA indicates that transparent operation from port B to port A has been enabled. The clocked Q output of register 220B is the signal TESTMODE. When MRES is deasserted, the signals BYPA and BYPB are clocked into the respective registers 220A and 220B.

Figure 8:
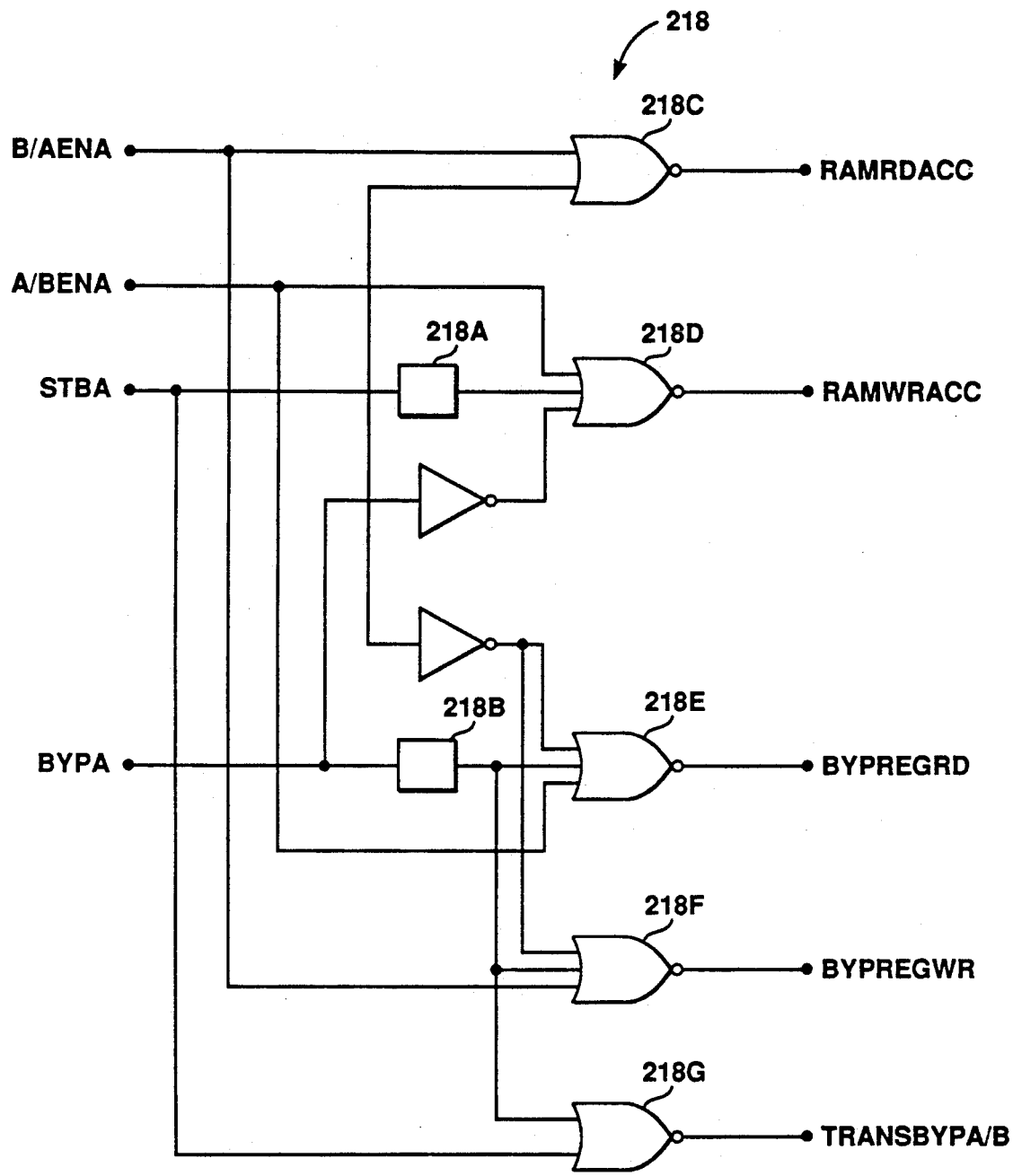

FIG. 8 is a schematic diagram of circuit 218; circuit 220 is identical to circuit 218. The circuit 218 acts as control logic to generate internal control signals RAMRDACC, RAM WRITE PORT A, BYP REGISTER RD A, BYP REGISTER WR A AND TRANSPARENT BYP A/B from signals B/AENA, A/BENA, STBA and BYPA. The respective STBA and BYPA signals are passed through delay path circuits 218A and 218B. Logic gates 218C-218G operate on respective input signals to provide the circuit output logic signals. It is noted that a FIFO RAM access always takes place if the port is set up to read the RAM. By using the delay lines (devices 218A and 218B), a decision is made late in the cycle as to which data will be multiplexed out of the buffer 202 or 204. By using the delayed signal, another signal is generated that can be combined at logic gate 218D with the undelayed BYPA signal to determine the type of access. The same type of delay is performed on BYPA. In this type of access, if the BYPA signal is asserted with a deasserted STBA signal, the bypass register is written. The delayed BYPA signal is combined with the undelayed STBA signal at logic gate 218E to determine if the bypass register should be written. If STBA becomes true before the delayed BYPA signal becomes true, the device becomes transparent, i.e., it enters the transparent mode.

The user must of course meet external setup times for the signals in order for the scheme to work.

The data write function of the device works using these delay signals also. The unique feature here is that all the data is written into the registers or memory at the end of the cycle. This keeps the data in the FIFO RAM or register from being corrupted until the delay paths have determined the true type of access.

The test mode of the device 200 is determined by having BYPB asserted while MRES is being deasserted. This allows data previously written in the FIFO to be retrieved by the same port that wrote the data.

The sequence to accomplish the testing of the device follows. The user asserts MRES and deasserts BYPA and BYPB. This configures the device 200 in a buffer 202-to-buffer 204 FIFO transfer mode. The user then deasserts MRES and writes the locations of the FIFO RAM 206 in a normal manner. When the FIFO is filled up, the user then asserts BYPA and BYPB while asserting and then deasserting the MRES pin. This will have the effect of turning the FIFO around while enabling the FIFO RAM to be read. This allows the user to read the contents of the FIFO just written.

Figure 9A:
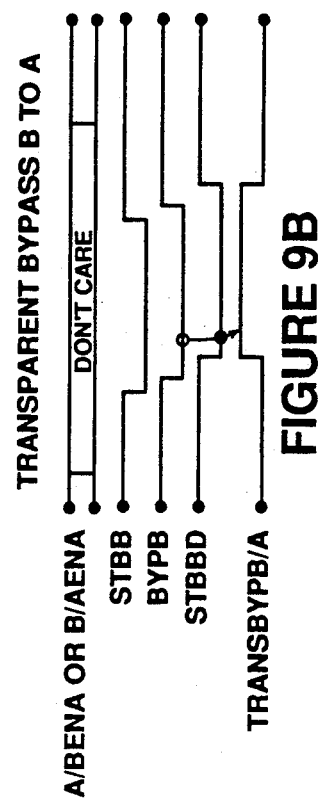
FIGS. 9A–9F are waveform timing diagrams illustrative of the interrelationships of some of the control signals for the device of FIG. 6.
Figure 9B:
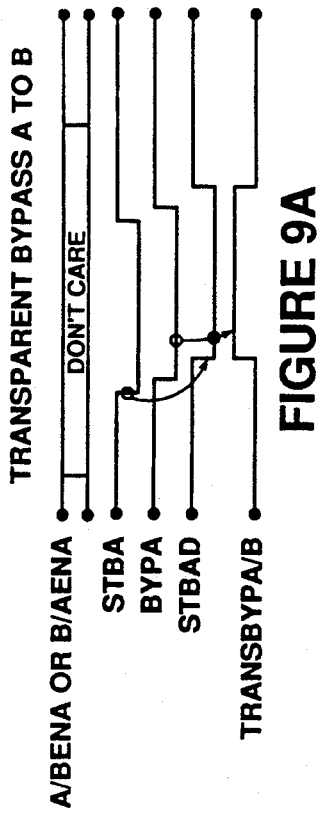
Figure 9C:
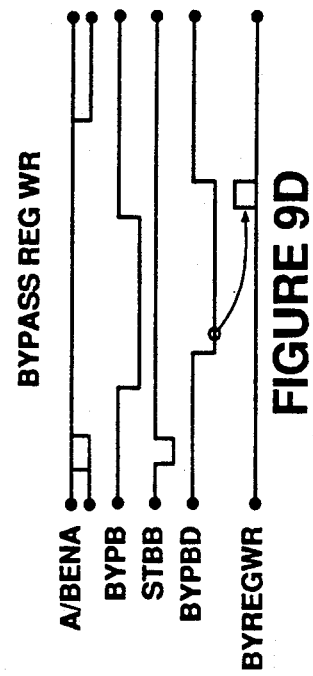
Figure 9D:
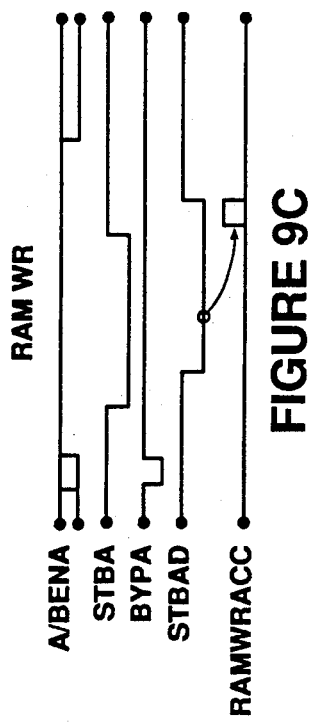
Figure 9E:
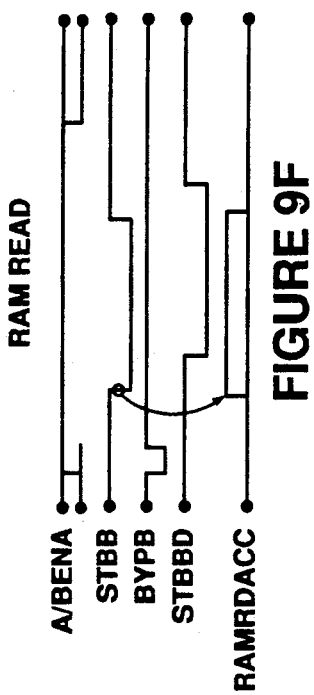
Figure 9F:
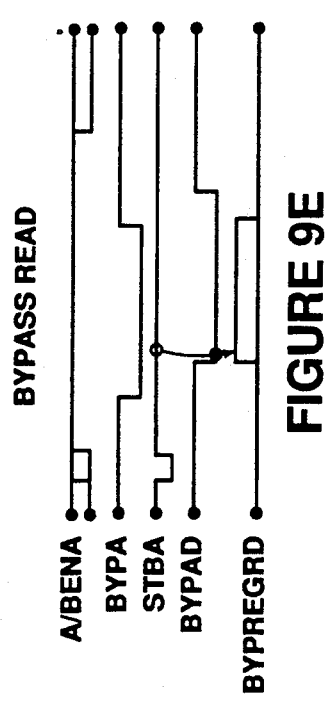

FIGS. 9A-9F illustrate the signal waveform timing for selecting various modes of operation of the device of FIG. 6. Thus, FIG. 9A illustrates selection of the transparent bypass operation from port A to port B, while FIG. 9B illustrates the selection of the transparent bypass operation from port B to port A. FIG. 9C illustrates selection of the FIFO RAM write operation. FIG. 9D illustrates the selection of the bypass register write operation. FIG. 9E shows selection of the bypass read operation, and FIG. 9F shows operation of the FIFO RAM read operation.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A bi-directional first-in-first-out (FIFO) memory device on a monolithic integrated circuit chip, comprising:
   first and second device input/output (I/O) ports;
   a single FIFO memory array for holding the FIFO data no matter which direction data is transferred through said FIFO device, said array comprising an input data port and an output data port;
   means responsive to a first control signal for selectively coupling either said first or said second device I/O port to said input data port of said memory array;
   means responsive to a second control signal for selectively coupling either said first or said second device I/O port to said at least one output data port of said memory array; and
   means responsive to transparent bypass control signals for operating said device in a transparent bypass mode of operation, wherein data asserted at one of said first and second ports bypasses said FIFO memory array and is transferred directly to said other of said first and second ports without passing through said FIFO memory array;
   whereby said FIFO device may be operated for data transfer either from said first I/O port to said second I/O port or vice versa depending upon the setting of said means responsive to said first control signal and said means responsive to said second control signal, enabling data transfer from said first I/O port to said second I/O port when said first I/O port is coupled to said input data port of said memory and said second I/O port is coupled to said output data port for said device, and enabling data transfer from said second I/O port to said first I/O port when said second I/O port is coupled to said input data port and said first I/O port is coupled to said output data port.

2. The FIFO device of claim 1 wherein said means responsive to said first control signal comprises a first multiplexer circuit, and said means responsive to said second control signal comprises a second multiplexer circuit.

3. The FIFO device of claim 1 wherein said first and second control signals are asserted on first and second control pins of said device.

4. The FIFO device of claim 1 wherein said means for operating said device in a transparent bypass mode of operation comprises a first tri-state buffer circuit coupling said first I/O port to said second I/O port and selectively allowing data transfer directly through said tri-state buffer circuit from said first I/O port to said second I/O port, and a second tri-state buffer circuit coupling said second I/O port to said first I/O port and selectively allowing data transfer directly through said tri-state buffer circuit from said second I/O port to said first I/O port.

5. The FIFO device of claim 1 further comprising means for preventing normal FIFO read or write operations to said FIFO memory array during the time in which said device is operating in said transparent bypass mode of operation.

6. A bi-directional first-in-first-out (FIFO) memory device on a monolithic integrated circuit chip, comprising:
   first and second device input/output (I/O) ports;
   a single FIFO memory array for holding the FIFO data no matter which direction data is transferred through said FIFO device, said array comprising an input data port and an output data port;
   means responsive to a first control signal for selectively coupling either said first or said second device I/O port to said input data port of said memory array;
   means responsive to a second control signal for selectively coupling either said first or said second device I/O port to said output data port of said memory array, whereby said FIFO device may be operated for data transfer either from said first I/O port to said second I/O port or vice versa in dependence on the setting of said means responsive to said first control signal and said means responsive to said second control signal;
   means responsive to transparent bypass control signals for operating said device in a transparent bypass mode of operation, wherein data asserted at one of said first and second ports bypasses said FIFO memory array and is transferred directly to said other of said first and second ports without passing through said FIFO memory array; and
   means responsive to registered bypass control signals for operating said device in a registered bypass mode of operation, wherein data may be transferred via a clocked register from one I/O port for later retrieval by the other I/O port without affecting either the contents of the FIFO memory array or FIFO operations occurring at the other I/O port.

7. The FIFO device of claim 6 wherein said means responsive to said first control signal comprises a first multiplexer circuit, and said means responsive to said second control signal comprises a second multiplexer circuit.

8. The FIFO device of claim 6 wherein said first and second control signals are asserted on first and second control pins of said device.

9. The FIFO device of claim 6 wherein said means for operating said device in a transparent bypass mode of operation comprises a first tri-state buffer circuit coupling said first I/O port to said second I/O port and selectively allowing data transfer directly through said tri-state buffer circuit from said first I/O port to said second I/O port, and a second tri-state buffer circuit coupling said second I/O port to said first I/O port and selectively allowing data transfer directly through said tri-state buffer circuit from said second I/O port to said first I/O port.

10. The FIFO device of claim 6 further comprising means for preventing normal FIFO read or write operations to said FIFO memory array during the time in which said device is operating in said transparent bypass mode of operation.

11. The FIFO device of claim 6 wherein said means for operating said device in a registered bypass mode of operation comprises a first clocked register for receiving data from said first I/O port and a first tri-state buffer circuit for selectively coupling the clocked output of said first register to said second I/O port, and a second clocked register for receiving data from said second I/O port and a second tri-state buffer circuit for selectively coupling the clocked output of said second register to said first I/O port.

12. The memory device of claim 6 further comprising device mode selection means for selecting the device operating mode, said mode selection means comprising first and second device control pins, and means for monitoring the state of control signals applied to said device control pins, wherein the status of signals applied to said first and second control pins controls operations at said first I/O port.

13. The memory device of claim 12 wherein said mode selection means further comprises means for nominally selecting a FIFO read operation from said first I/O port in response to assertion of a control signal of a predetermined state on said first control pin, and means for nominally selecting a registered bypass operation of reading said internal register from said first I/O port in response to assertion of a control signal of a predetermined logic state on said second control pin, if within a predetermined "time out" interval started after assertion of said control signal on said second pin a control signal is not asserted on said first control pin of said predetermined logic state.

14. The memory device of claim 13 wherein said mode selection means further comprises means for selecting said transparent mode of operation to transfer data directly from said first I/O port to said second I/O port if a control signal of said predetermined logic state is asserted on said first control pin within said "time out" interval after assertion of a control signal of a predetermined logic state on said second control pin.

15. The memory device of claim 6 further comprising means operable during a device testing mode for reading data written into said FIFO memory array out of the device I/O port through which said data was written.

16. A user-testable first-in-first-out (FIFO) memory device on a monolithic integrated circuit chip, comprising:
   first and second device data ports, said first device data port comprising means for inputting data into said FIFO device during normal operation of said FIFO device, said second device data port comprising means for outputting data from said FIFO device during normal operation of said FIFO device, and wherein during a device test mode data may be read out of said FIFO device;
   a FIFO memory array having an input data port and an output data port;
   first means for coupling data from said first device data port to said input data port of said FIFO memory array to write data into said array during normal device operations;
   second means for coupling data from said output data port of said FIFO memory array to said first device data port during normal device operations, wherein data is available at said second device data port in the same order it was presented to the first device data port; and
   third means for coupling data from said output data port of said FIFO memory array to said first device data port during a test mode of operation of said device.

17. A method of integrated circuit device mode selection, comprising a sequence of the following steps:

observing the state of first and second predetermined device control pins;

starting a predetermined "time out" time interval in the event said state of said first pin transitions to a predetermined state;

selecting a first device mode if said second device control pin transitions to a predetermined state before expiration of said "time out" interval;

selecting a second device mode if said second device control pin does not transition to said predetermined state before expiration of said "time out" interval.

18. The method of claim 17 further comprising the step of preliminarily selecting said second device mode when said first pin transitions to said predetermined state, but wherein said second mode is not entered until after expiration of said "time out" interval without transition of said second device control pin to said predetermined state for said pin during said interval.

19. A bi-directional first-in-first-out (FIFO) memory device on a monolithic integrated circuit chip, comprising:

first and second device input/output (I/O) ports;

a single FIFO memory array for holding the FIFO data no matter which direction data is transferred through said FIFO device, said array comprising an input data port and an output data port;

means responsive to a first control signal for selectively coupling either said first or said second device I/O port to said input data port of said memory array;

means responsive to a second control signal for selectively coupling either said first or said second device I/O port to said at least one output data port of said memory array; and means responsive to registered bypass control signals for operating said device in a registered bypass mode of operation, wherein data may be transferred via a clocked register from one I/O port for later retrieval by the other I/O port without affecting either the contents of the FIFO memory array or FIFO operations occurring at the other I/O port, and wherein the direction of registered bypass data is opposite to that of the selected FIFO data transfer operation through the device;

whereby said FIFO device may be operated for data transfer either from said first I/O port to said second I/O port or vice versa depending upon the setting of said means responsive to said first control signal and said means responsive to said second control signal, enabling data transfer from said first I/O port to said second I/O port when said first I/O port is coupled to said input data port of said memory and said second I/O port is coupled to said output data port for said device, and enabling data transfer from said second I/O port to said first I/O port when said second I/O port is coupled to said input data port and said first I/O port is coupled to said output data port.

20. The FIFO device of claim 19 wherein said means for operating said device in a registered bypass mode of operation comprises a first clocked register for receiving data from said first I/O port and a first tri-state buffer circuit for selectively coupling the clocked output of said first register to said second I/O port, and a second clocked register for receiving data from said second I/O port and a second tri-state buffer circuit for selectively coupling the clocked output of said second register to said first I/O port.

21. A bi-directional first-in-first-out (FIFO) memory device on a monolithic integrated circuit chip, comprising:

first and second device input/output (I/O) ports;

a single FIFO memory array for holding the FIFO data no matter which direction data is transferred through said FIFO device, said array comprising an input data port and an output data port;

means responsive to a first control signal for selectively coupling either said first or said second device I/O port to said input data port of said memory array;

means responsive to a second control signal for selectively coupling either said first or said second device I/O port to said at least one output data port of said memory array; and means operable during a device testing mode for reading data written into said FIFO memory array out of said device I/O port through which said data was written;

whereby said FIFO device may be operated for data transfer either from said first I/O port to said second I/O port or vice versa depending upon the setting of said means responsive to said first control signal and said means responsive to said second control signal, enabling data transfer from said first I/O port to said second I/O port when said first I/O port is coupled to said input data port of said memory and said second I/O port is coupled to said output data port for said device, and enabling data transfer from said second I/O port to said first I/O port when said second I/O port is coupled to said input data port and said first I/O port is coupled to said output data port.

* * * * *